United States Patent [19]

Middelman et al.

[11] Patent Number: 5,662,761

[45] Date of Patent: Sep. 2, 1997

[54] METHOD OF MANUFACTURING A UD-REINFORCED PWB LAMINATE

[75] Inventors: Erik Middelman, Arnhem; Pieter Hendrik Zuuring, Nijmegen, both of Netherlands

[73] Assignee: AMP-Akzo Lin Lam VOF, Arnhem, Netherlands

[21] Appl. No.: 374,592

[22] PCT Filed: Jul. 20, 1993

[86] PCT No.: PCT/EP93/01919

§ 371 Date: Feb. 2, 1995

§ 102(e) Date: Feb. 2, 1995

[87] PCT Pub. No.: WO94/02306

PCT Pub. Date: Feb. 3, 1994

[30] Foreign Application Priority Data

Jul. 21, 1992 [NL] Netherlands ............. 9201303

[51] Int. Cl.⁶ .................. B65C 9/25; B32B 3/00; H05K 1/00
[52] U.S. Cl. .................. 156/324; 156/166; 156/269; 156/307.7; 156/176; 428/209; 428/901; 428/107; 428/114; 428/195; 361/748; 361/750
[58] Field of Search .................. 428/209, 210, 428/901, 195, 107, 114; 361/748; 156/324, 324.4, 174, 169, 233, 307.7, 166, 269, 176

[56] References Cited

U.S. PATENT DOCUMENTS

| | | | |
|---|---|---|---|
| 3,150,026 | 9/1964 | Talv | 156/441 |
| 4,186,044 | 1/1980 | Bradley et al. | 156/273 |
| 4,420,359 | 12/1983 | Goldsworthy | 156/379.8 |
| 4,579,612 | 4/1986 | Held | 156/64 |
| 4,609,586 | 9/1986 | Jensen et al. | 428/209 |
| 4,659,425 | 4/1987 | Eggers et al. | 156/630 |
| 4,687,528 | 8/1987 | Held | 156/150 |
| 4,755,252 | 7/1988 | Held | 156/389 |
| 4,814,945 | 3/1989 | Leibowitz | 361/414 |
| 4,943,334 | 7/1990 | Medney et al. | 156/174 |

FOREIGN PATENT DOCUMENTS

| | | | |
|---|---|---|---|
| 0 120 192 | 10/1984 | European Pat. Off. | B32B 31/08 |
| 0 203 368 | 12/1986 | European Pat. Off. | B32B 15/04 |
| 0 215 392 | 3/1987 | European Pat. Off. | B29C 43/22 |
| 0 327 838 | 8/1989 | European Pat. Off. | B32B 31/08 |
| 0 478 051 | 4/1992 | European Pat. Off. | B29C 67/14 |
| 2 330 530 | 6/1977 | France | B29H 7/22 |
| 2 333 638 | 7/1977 | France | B29H 7/22 |
| 766684 | 2/1976 | South Africa . | |
| 1571100 | 7/1980 | United Kingdom | B32B 5/03 |
| WO92/22192 | 12/1992 | WIPO | H05K 3/46 |

OTHER PUBLICATIONS

International Search Report for PCT/EP93/01919 dated Dec. 14, 1993.

*Primary Examiner*—Patrick Ryan
*Assistant Examiner*—Cathy F. Lam
*Attorney, Agent, or Firm*—Loretta A. Miraglia; Louis A. Morris

[57] ABSTRACT

The invention relates to a method of manufacturing a composite laminate, preferably a cross-ply laminate, in which process unidirectionally oriented (UD) fibres (3) are provided with matrix material (7) and, together with a pre-formed non-flowing UD composite or cross-ply laminate, passed through a laminating zone (13) in layers of at least two different orientational directions. More particularly, the invention relates to the manufacture of composite material which is pre-eminently suited to be used as a supporting substrate for printed wire boards. The method according to the invention is directed in particular to the utilisation of a double belt press, both for making the preformed non-flowing UD composite and for the manufacture of the final laminate. The invention also comprises printed wire board (PWBs) and multilayer PWBs.

26 Claims, 1 Drawing Sheet

METHOD OF MANUFACTURING A UD-REINFORCED PWB LAMINATE

The invention relates to a method of manufacturing a composite laminate, more particularly a cross-ply laminate, in which process unidirectionally oriented (UD) fibres provided with not yet consolidated matrix material are passed through a laminating zone in layers of at least two different orientational directions, and the matrix material is consolidated. More particularly, the invention relates to the manufacture of composite material which is pre-eminently suited to be used as a substrate for a printed circuit, i.e. a printed wire board, hereinafter referred to by the abbreviation PWB.

BACKGROUND OF THE INVENTION

Such a method is known from EP 478 051. This document discloses the continuous manufacture of a flat substrate from a fibre-reinforced matrix, which process comprises the use of at least two moving layers of parallel, rectilinearly extending reinforcing fibres not bonded in the fore of a woven fabric (UD fibres), providing said UD fibres, which are positioned in at least two crossing directions, with matrix material, and passing them through a laminating zone, for instance a double belt press, to fore a cross-ply laminate. By this process laminates may be obtained which are pre-eminently suitable as PWB substrate on account of, int. al., their good surface area quality, their comparatively low linear thermal coefficient of expansion (TCE) in the x and y directions, the option of incorporating a high content of fibres, and their favourable dimensional stability.

A drawback to the known method is that the laying of the fibres in two directions and their being provided with matrix material before or after said laying, prior to the curing of the matrix material provided with fibres, requires a comparatively complex apparatus. Another disadvantage is that in order to retain the desired orientation, generally 90°, the UD fibres must be kept under tension throughout the entire process. Also, it is desired to increase the process's yield of material.

Another method of manufacturing a UD layer-reinforced composite laminate, which likewise is intended to be used as a PWB substrate, is known from U.S. Pat. No. 4,943,334. In this process reinforcing filaments are wound about a square flat mandrel in several layers crossing at an angle of 90°, with the filaments being provided with curable matrix material by means of injection and/or impregnation. The matrix, which in consequence contains cross-wise applied UD fibre layers, is then cured. An advantage of this method is the low coefficient of expansion attainable in the thus manufactured substrate. A possible drawback to this method resides in the high interlaminar stresses extant in the manufactured product as a result of the anisotropy of the layers of which the laminate is composed. There is a risk of these stresses leading to delamination. The high production costs are another major disadvantage, and there is also the fact that a comparatively large quantity of material is wasted at the edges.

From U.S. Pat No. 4,420,359 it is known to manufacture reinforced plastics laminates by laminating one or more layers of a resin-impregnated, fibre-containing plastics material with rigid flat panels. The specification provides a description of an apparatus for laminating in which use is made of two continuous belts between which the lamination process is carried out.

At issue in U.S. Pat. No. 4,659,425 is the manufacture of PWBs by coating the surface of a metal foil with a thermosetting resin, contacting the thus coated metal foil with a reinforcing cloth, e.g. a glass fabric, to form a foil/cloth assembly, and then passing such foil/cloth assemblies through a double belt press in order to obtain a laminate.

The use of a double belt press in manufacturing PWB laminates and multi-layer PWBs is also known as such from EP 120 192, EP 203 368, EP 215 392, and EP 327 838. However, these publications do not make mention of UD layer-reinforced composites.

Composite materials for PWBs in which individual cross-wise positioned UD layers are employed are known from U.S. Pat. No. 4,814,945. This publication relates to a resin reinforced with parallel fibres of aramid being used as a PWB substrate. Several resin layers heated to a semi-cured or B stage and so UD-reinforced are placed one on top of the other and then cured. A drawback to the use of resin layers in the B stage is that, on account of the flow which occurs during lamination, the tension, and hence the orientation of the UD layers cannot be adequately controlled, causing a deficiency in flatness. Particularly in the case of PWB laminates a deficiency in flatness is a disadvantage. A further drawback associated with the use of resin layers in the B stage has to do with the problems involved in storing such a still reactive material.

The background art further includes:

U.S. Pat. No. 4,609,586, from which a cross-ply laminate for PWBs is also known. This, however, is a carbon fibre-reinforced metal matrix which is not utilised as the actual substrate (in this case a conventional glass fabric/epoxy composite), but as an additional supporting component.

U.S. Pat No. 3,150,026 discloses an apparatus for producing a non-woven, plastic reinforced fabric, wherein parallel fibrous warp strands are advanced along a support, consecutive lengths of parallel weft strands are placed onto the advancing band of warp strands, and wherein downstream of the support a bonding resin is applied to the warp and weft strands and cured.

U.S. Pat. No. 4,186,044 discloses a device for continuously pressurizing and curing resin impregnated multilayered reinforcements into an elongated laminated composite structure.

In FR 2 330 530 a reinforced belt is produced by advancing two parallel rolls of longitudinal reinforcement material, applying transversal reinforcement material to form a continuous belt of bidirectional reinforcement material, providing a bonding agent, and bonding the reinforcement.

FR 2,333,638 discloses the manufacture of rubber transport belts involving the extrusion of reinforced belts, cutting similarly manufactured belt material into panels, and transversally providing the produced belts with said panels, followed by pressing and vulcanizing.

The invention has for its object to provide a simple, comparatively inexpensive method of manufacturing UD-reinforced composites without the drawbacks associated with the prior art discussed hereinbefore. Notably, it is envisaged to manufacture UD-reinforced composites which are pre-eminently suited to be used as a PWB substrate.

SUMMARY OF THE INVENTION

To this end, the invention consists in that in a process of the aforementioned known type UD fibres provided with not yet consolidated matrix material are passed through the laminating zone together with a pre-formed, non-flowing UD composite.

DETAILED DESCRIPTION

Figure 1:
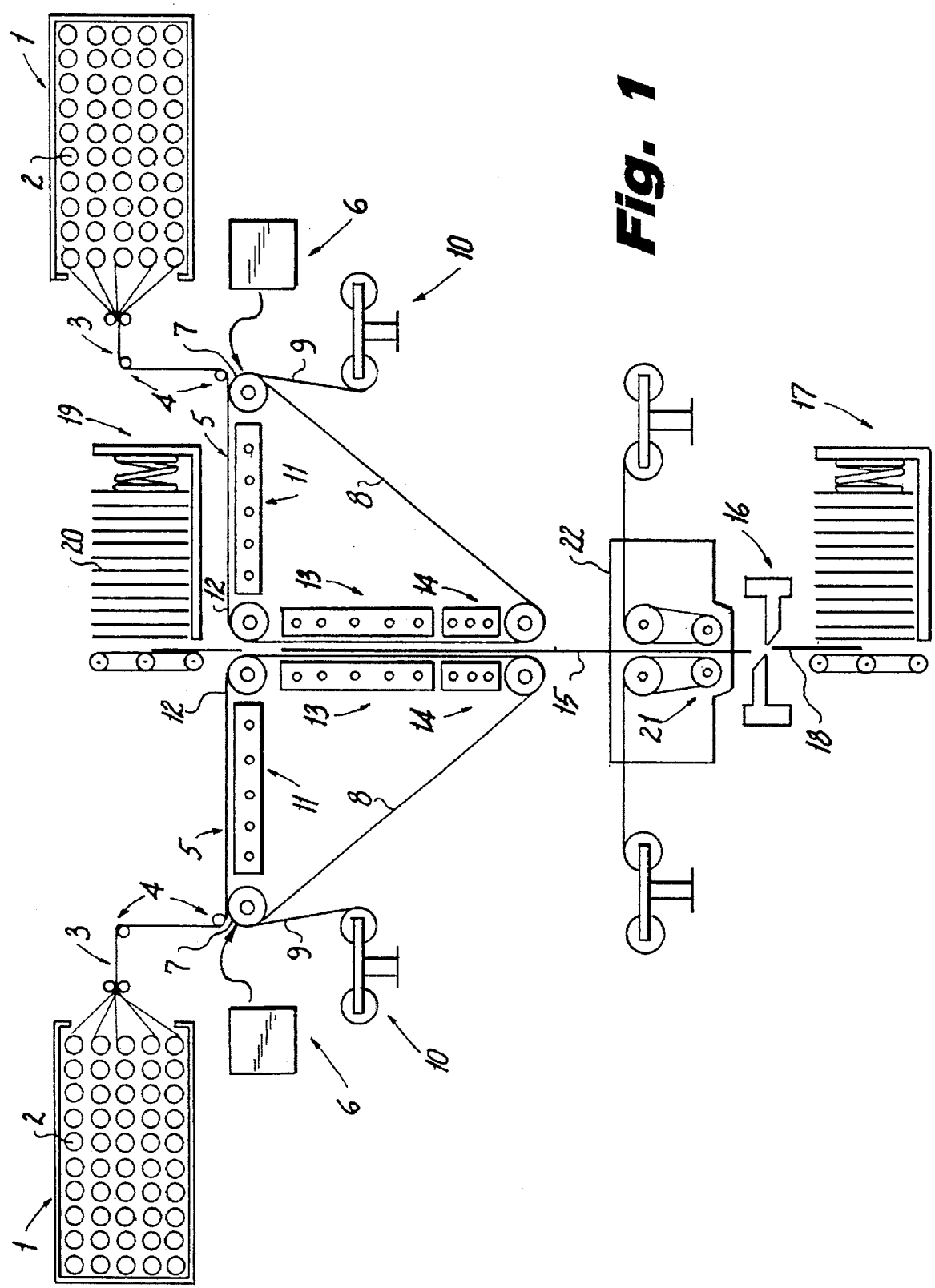

The term "non-flowing UD composite" is used to indicate a composite material comprising unidirectionally oriented reinforcing fibres enclosed in a matrix material which has been solidified (consolidated) to the extent of not being brought to flow again during the remainder of the manufacturing process. In general, this means that during storage and processing the non-flowing UD composite is under such conditions of pressure and temperature that it is in a state below its softening point (i.e., below Tg or apparent Tg). The several matrix material (matrix resin) stages are customarily identified in the art as the "A", "B", and "C" stages, the A stage indicating unsolidified resin (i.e., in the case of a thermoset resin: the uncured stage), the B stage generally indicating partial solidification (in the case of a thermoset resin: the reaction has proceeded through the formation of longer chains, but not to full network formation), and the C stage indicating a solidified (cured) stage. For convenience of storage and processing, it is preferred for the solidification of the non-flowing UD-composite to have reached the C stage, or for resins to be used such as those comprising rigid molecular chains in which under regular storage and processing conditions a non-flowing state may already be attained at a stage still called the B stage. However, notably when in the laminating zone pressing is conducted under isobaric conditions, also A stage material can be employed. The terms A stage, B stage and C stage are known to the person of ordinary skill in the art and require no further elucidation here.

The term not yet consolidated matrix material refers to matrix material of sufficiently low viscosity under the conditions at which it is applied to the UD fibres as to allow impregnation, such as thermoplastic resins in the liquid state. Not yet consolidated thermoset resins generally are in the A or the B stage (except for those thermoset resins referred to above, for which it holds that they are no longer flowable in the B stage).

It should be noted that the passing through the laminating zone of UD fibres provided with not yet consolidated matrix material allows the use of a non-flowing UD composite to which no stringent requirements with regard to adhesion apply, sufficient adhesion being provided by the as yet unconsolidated matrix material. The unconsolidated matrix material generally is a liquid, but could conceivably be a free flowing powder capable of being applied to the UD fibres.

The orientational direction of the reinforcing fibres in the preformed, non-flowing UD composite is different from the orientational direction of the fibres provided with matrix material with which it is laminated. For obtaining a UD-reinforced laminate having the desired orthotropic properties, it is preferred to have the two orientational directions mutually perpendicular to each other. With a view to practicability it is preferred for the orientational direction of the fibres which are provided with matrix material to be equal to the machine direction during the laminating process.

As has long been known, UD-crossply laminates preferably are balanced and symmetric. The term "balanced" indicates equal properties in perpendicular directions (e.g. an equal number of filaments in the x and y directions), the term "symmetric" indicates mirror image symmetry over the thickness of the laminate, i.e., the laminate is midplane symmetric. In order to produce such a balanced and symmetric laminate the method of the invention can be carried out advantageously in symmetric fashion, i.e., by so feeding the UD fibres provided with not yet consolidated matrix material that they are positioned on both sides of the non-flowing UD composite, the term "sides" indicating the outer surfaces of the non-flowing UD-composite (which generally is in the form of a thin, flat panel).

Further, the process according to the invention may be repeated a number of times. In that case, instead of the non-flowing UD composite being employed, use is made in each subsequent laminating step of a non-flowing composite laminate, usually a cross-ply laminate, such as manufactured in the manner taught hereinbefore. In the process according to the invention the non-flowing cross-ply laminate should be passed through the laminating zone in such a direction as will give a balanced and midplane symmetric laminate.

In general, it is advisable to post-cure the composite laminate manufactured by a process according to the invention after the final laminating step, in order to ensure full conversion in all layers.

A major advantage of manufacturing a non-flowing composite panel reinforced with UD fibres in a first step is that it is not necessary to keep the UD fibres under tension throughout the entire manufacturing process, since the non-flowing matrix material conserves the required orientation. As compared with the prior art, the process according to the invention thus provides easier and superior conservation of the orientation which is so vital to the manufacture of UD fibre-reinforced composites.

An additional advantage of the process according to the invention is that it is very suitable for the use of resins of a high molecular weight without the employment of a solvent, and also for catalysed resins (of importance in the case of electroless additive metallisation). Such commercially significant resins are insufficiently impregnated by methods in which various UD layers are stacked one on top of the other and subsequently impregnated (as described in EP 478 051 mentioned hereinbefore).

The manner in which the non-flowing UD composite is manufactured is not critical to the properties of the final product. The person of ordinary skill in the art is free to choose from several known methods of manufacturing a unidirectional fibre-reinforced composite. One appropriate technique may consist in, say, the impregnation with synthetic resin of a reinforcing fibre layer as it is unwound from a bobbin holder or a creel. This impregnation may be carried out, say, by guiding the fibres through a bath containing liquid or dissolved matrix material. Alternatively, it is possible to make use of the matrix material in the powdered form, or in the form of an emulsion or suspension. Preferably, however, liquid or dissolved matrix material is fed from a metering device to the fibres being unwound from the bobbin holder. The matrix material reinforced with unidirectionally oriented fibres produced in this way is then consolidated (solidified to the extent required), preferably without any interruption of the process. In the case of a thermosetting matrix being employed, the consolidation is effected by curing the matrix material. Such curing is preferably carried out at elevated temperature but, depending on the resin used, it is also possible to utilise ultraviolet light or microwaves among others. In the case of a thermoplastic matrix being employed, the consolidation is effected by cooling the synthetic material. In the case of semi-crystalline materials, there should be cooling to below the melting point, in the case of amorphous plastics to below the glass transition temperature.

According to the invention, the use of a double belt press is preferred as the best possible method of obtaining the UD composite. Via this double belt press the fibres are at least guided pass a metering device to be impregnated with the matrix material, and by a compression zone. Depending on the type of matrix material used, the resin impregnated fibres are passed through one or more consolidation zones, while the UD composite formed may in addition be passed by a cleaning zone and a cooling zone if necessary. If so desired, the process may be repeated to obtain a thicker UD composite, in which case the UD composite prepared earlier is introduced into the double belt press and laminated with UD fibre-containing, not yet consolidated matrix material, such that the orientation of the UD fibres in the earlier formed UD composite equals the machine direction.

It is immaterial how the UD fibres provided with matrix material which are passed through the laminating zone together with the pre-formed, non-flowing UD composite are provided. One possible method is to coat a fibre bed with matrix material, another consists of passing individual fibres through a bath containing matrix material. Alternatively, use may be made here of a UD prepreg. It is preferred that the fibres be passed through a feeding zone during or after which they are provided with matrix material. The feeding zone may involve means for spreading filaments and for adjusting tension and orientation. It is preferred that an unpressurized, preheated feeding zone be used. A viable heating means is direct gas flame heating.

To form the final composite laminate one or more layers of the thus pre-formed flat, non-flowing UD composite should be laminated with the UD fibre-reinforced matrix material in such a way that the orientational direction of the fibres in the already pre-formed UD composite is different from the orientational direction of the fibres provided with matrix material which are laminated with the UD composite. Preferably, the orientational directions are perpendicular to each other, and as indicated above a balanced and mid-plane symmetric laminate is provided. The plane of symmetry, which runs through the centre of the laminate and is parallel to the laminate's outer surfaces, either is the boundary between two UD layers, or is an imaginary plane running through one UD layer, depending on the number and order of UD layers over the thickness of the laminate. A balanced and mid-plane symmetric laminate provided with crosswise applied UD-reinforced layers is known as a UD cross-ply laminate. A major advantage of such a UD cross-ply laminate consists in the isomorphism of its properties in the x and y directions (i.e., the two fibre directions perpendicular to each other).

More particular preference is given to the laminate being so composed that the UD-reinforced layers are oriented as specified in one of the following models, with 0° and 90° standing for orthogonal orientational directions and the relative thickness of the layers being indicated by repeating the given orientation where necessary:

0°/90°90°/0°.

0°/90°90°/0°0°/90°90°/0°.

In general, for utilisation in PWBs the UD-reinforced layers in the laminate according to the invention will each have a thickness in the range of 6 to 800 µm, preferably of about 15 to 400 µm.

Alternatively, it is possible according to the invention to apply several layers one on top of the other in a single laminating step. It is possible, for instance, to pass several pre-formed, non-flowing UD composites and/or cross-ply laminates through the laminating zone together with the UD fibres provided with not yet consolidated matrix material. More particularly, the lamination of several layers may be exploited by also making use of UD prepreg, i.e., a layer of UD fibres provided with matrix material that is solid at feeding temperature (usually room temperature) but is still flowable under processing conditions. In that case, t is preferred to pass the UD prepreg through the laminating zone in between pre-formed, non-flowing UD composites or pre-formed non-flowing cross-ply laminates.

It should be noted that the invention also allows the manufacturing of virtually endless tapes of UD composite or UD crossply. As a rule, such tapes will be wound onto a reel directly after manufacturing. It should further be noted that the invention allows the manufacture of a non-symmetrical 0°/90° UD-crossply laminate. Several of such 0°/90° basis materials can be stacked in any desired manner, in such an order so as to form a balanced and symmetric UD crossply laminate. According to the invention, in addition to the UD-reinforced layers one or more layers comprised of a non-woven or a woven fabric may optionally be applied in plane of mirror symmetry by being carried along through the laminating zone. In that case, according to the invention, the layers composed of a non-woven or a woven fabric alternate with UD fibre-reinforced layers, preferably in such a way that the outermost fibre-reinforced layers are always formed by the UD layers. This allows for the dielectric constant being adjusted to the desired extent while the substrate's good surface quality is maintained, and for a further reduction of interlaminar stresses.

Particularly advantageous results may be obtained when in the process according to the invention a double belt press is used as laminating zone. In consequence, the invention more preferably provides a method of manufacturing a laminate of composite UD layers, preferably a cross-ply laminate, comprising a first step of forming a non-flowing UD composite by providing UD fibres with matrix material, passing the UD fibres provided with matrix material through a double belt press, and rendering the matrix material non-flowing, and a second step of introducing a measured section of the pre-formed, non-flowing UD composite into the double belt press and laminating said composite with UD fibre-containing matrix material in this manner. In practice, it may be expedient to carry out the two steps in the same device but, of course, this is not required.

Greater preference is given to the manufacture of a virtually endless UD composite in the first step and cutting measured sections off it to a length equal to the width of the material leaving the double belt press. In this way any loss of material is virtually prevented, which makes for a major economic advantage. According to the invention, the most suitable method of manufacturing the desired cross-ply laminate is a symmetrical process, and consists in the pre-formed, non-flowing UD composite being passed through the double belt press again in such a way that to the two outer surfaces of the pre-formed UD composite there are joined UD fibres provided with matrix material of which the orientational direction is perpendicular to the orientational direction of the pre-formed UD composite. The fibres not yet provided with matrix material are thus unwound in the machine direction in the double belt press both when manufacturing the pre-formed UD composite and during the final lamination. Ordinarily, in the laminating step the pre-formed UD composite is so introduced into the double belt press as to give a fibre orientation perpendicular to the machine direction. Alternatively, according to the invention, in a laminating step UD fibre-containing matrix material may be joined to a pre-formed, non-flowing UD composite of even orientation (the machine direction), and in a further laminating step the thus formed thicker UD composite may be worked into a cross-ply laminate. In this way a cross-ply laminate of the following construction may be obtained:

90°/90°/0°/0°0°/0°/90°/90°.

It should be noted that double belt presses are known to those of ordinary skill in the art, and no further elucidation in a general sense is required here. The method according to the invention may be practised using other types of laminating zones, but the use of a double belt laminating zone (not necessarily with pressure being exerted) is preferred.

Also in the case of embodiments employing a symmetric production process and equipment, such as the double belt press mentioned hereinbefore, the present invention still allows the production of asymmetric 0°/90° basic material. To this end, if desired, it is convenient to feed a release foil into the production machine, in the production direction, so as to obtain two, releasably bonded, separate laminates rather than a single laminate of full thickness. Thus, in a first step, two layers of UD fibres provided with not yet consolidated matrix material are passed through the machine and cured, but by virtue of the release foil not joined by lamination. Such a package of two distinct non-flowing UD-composites can be transversally fed into the production machine again, to be adjoined, in accordance with the process of the invention, with UD fibres provided with not yet consolidated matrix material, laminated, and cured. Thus, two releasably bonded separate 0°/90° UD-crossply basic materials are formed. Similarly, release foils can be fed into the laminating zone at any desired stage of the production process of composite laminates in accordance with the invention, thus providing ample freedom in the production of laminates having any desired number and order of UD-layers also when a symmetric production process is employed. Release foils, e.g., PTFE foil (polytetrafluoroethylene), are known to the man skilled in the art.

In the process of the present invention use is preferably made of a double belt press comprising an isobaric laminating zone. The advantage of this type of press as compared with dimension controlled presses is that it is the amount of material fed into the press rather than the width of the laminating zone (the spacing between the belts) which is determinative of the thickness of the resulting laminate. Such presses allow for the manufacture of thin laminates having minimal variation in thickness if any (the variation in thickness is a percentage of the overall thickness in the case of isobaric presses; in the case of dimension controlled presses it is absolute).

Alternatively, the non-flowing cross-ply laminate passed through the laminating zone may have been manufactured in a manner not according to the invention. Also, it may be that such a cross-ply laminate is not passed through the laminating zone except together with copper foil. In such a case also the use of an isobaric laminating zone-containing double belt press is of advantage even if not all of the favourable aspects of the above-described method are exploited.

To further reduce the quantity of any waste material formed at the edges it may be advantageous in a process according to the invention when employing an isobaric double belt press to have a viscous thermoplastic polymer which will also deform under isobaric conditions carried along at the edges of the material passed through the double belt press (e.g., by extrusion). The positive effect of such a technique is that any bending out of the press bands that may occur at their edges (giving a strip of thinner product which has to be cut off) will be forced into the polymeric edge material, thus substantially reducing the amount that needs to be cut off of the material leaving the double belt press. An additional advantage is that it is possible to manufacture products of differing widths in a single double belt press without creating more waste material at the edges than when the press is set for just one product width. Further, in the embodiments of the process according to the invention in which copper foil is carried along, there is no need for the projection of several centimetres' width of copper foil, as is required in known processes. In this manner substantial materials cost savings are attained. A drawback to the conventional processes, moreover, is that matrix material running out at the edges may be caught between the copper foil and the laminating belts. The adhesion of the matrix material to the copper and/or the belts which occurs under such circumstances will detrimentally affect the surface quality of material produced in such a fouled laminating zone. Hence it is preferred according to the invention to carry a poorly adhesive polymer, such as a polyolefin, along at the edges. More particularly preferred is the use of polyethylene or polypropylene.

As was mentioned hereinbefore, the method according to the invention notably serves to manufacture substrates for PWBs. Onto such substrates a conductive material is applied, usually in the form of copper traces. In general, the application of these traces may be via a subtractive or an additive method. When using the former a layer of metal foil is applied onto at least one of the outer surfaces of the PWB substrate. Next, using known techniques the metal foil is removed by etching in such a way as to give the desired pattern of traces. Foils which are suitable for use in the subtractive forming of conductive traces notably are composed of copper, nickel or gold. When the additive method is employed, the laminate is immersed in an electroless copperplating bath. In aid of this technique the laminate is to be rendered catalytic for the (redox) reaction in such a bath at the sites where there needs to be copper buildup. In actual practice, the entire laminate is rendered catalytic at least at the surface to be copperplated, while the sections which are not to be copperplated are covered with, say, a photosensitive resin.

The conductive material, or a catalytic layer, may be applied onto the laminates of the invention in any suitable manner, e.g., by providing the laminate with glue and adhering copper foil to it. In this respect the present invention also pertains to the use of a composite laminate made by any method in accordance with the foregoing description for manufacturing a printed wire board. It is preferred, however, to directly manufacture a laminate adapted to be used as a PWB, which the method according to the invention advantageously permits. Thus, the invention allows for the manufacture of laminates for both types of metallisation, either by the co-lamination of copper foil in a laminating step or by the addition to the matrix material of an additive which catalyses electroless copperplating. In addition, a coating which is catalytic to electroless copperplating may be applied either on-line or off-line. Such generally rubber-modified coatings are known to the person of average skill in the art and are commonly referred to as "additive adhesives," even though it is not a question of an actual adhesive so much as of a peel strength enhancing primer. The process according to the invention may involve off-line roll to roll adhesive coating, but also allows for the advantageous application of such a primer on-line with the final laminating step. In embodiments which involve the use of a double belt press with pacified steel belts, it is possible to galvanically provide the steel belts with copper, which upon lamination will come off the belts and adhere to the laminate surface.

It may be useful to provide an actual adhesive layer on composite materials such as those to which the invention relates. One such application regards the manufacture of multilayer PWBs (MLBs). MLBs comprise at least three layers of conductive material (copper traces). Generally, two of thee conductive layers are to be found on the outer surfaces of the MLB, at least one conductive layer consequently being present in an inner plane. All circuit layers in an MLB need to be separated from each other by a dielectric (i.e. an electrically insulating layer). While in conventional MLBs such a dielectric is a woven-fabric reinforced prepreg (glass-epoxy prepreg), the composite laminates made in accordance with the present invention are highly suitable for use as insulating panels that can serve as dielectrics in MLBs. The manufacture of MLBs, for which the composite materials according to the invention are pre-eminently suitable, may comprise the PWBs-and any intermediate uncoated substrates being bonded one on top of the other. To this end adhesive layers can be applied on either the insulating panels, or the PWBs, or both. It is preferred that the adhesive be provided on the insulating panels.

Copper clad laminates may also be provided—by coating or lamination, in-line or off-line—with a photosensitive layer (photoresist) such as commonly used for the subtractive formation of a circuit pattern.

When manufacturing composite materials provided with an adhesive layer on either outer surface an advantageous preferred embodiment of the process according to the invention consists in that the double belt press is set up in such a way that the fibres and the matrix material are in a horizontal plane during the steps preceding lamination, this to prevent gravity from exerting different influences on the two product sides. An additional advantage is that it is possible in such a set-up to keep the machine direction such that the aforementioned optional coating of the product as it is removed from the laminating zone takes place vertically, with the machine direction equalling the gravitational direction.

Alternatively, the product made by the process according to the invention (UD composite, cross-ply laminate) may be subjected to a surface treatment to improve adhesion. Such treatments, e.g., the corona treatment and the low pressure plasma treatment, are known. They are best carried out downstream of the laminating zone and prior to any coating being applied. It may be advantageous to pre-treat the belts in the laminating zone with a release agent. Release agents are known and are found primarily in two forms, i.e., those that transfer to the material guided through the laminating zone, and those that do not. The latter are preferred, though use may be made with advantage of the former if a surface treatment such as described above is to follow, since any transferred release agent may be removed during such a treatment. Alternatively, to prevent adhesion to the belts in the laminating zone a release foil may be carried along.

The invention further relates to a PWB substrate such as may be obtained using the process disclosed hereinbefore. At issue, in other words, is a substrate composed of a composite laminate which on at least one side has a surface adapted to PWB manufacture comprising matrix material with unidirectionally oriented reinforcing material embedded therein, such that the UD reinforcing material is present in several layers of crossing orientational directions, and the layers are symmetrically positioned vis-à-vis a plane of symmetry passing through the centre of the laminate parallel to its outer surfaces. PWB substrates according to the invention are characterised in that, across the thickness of the laminate, layers which are further removed from the plane of symmetry have undergone fewer thermal treatments than layers closer to said plane. For clarification, it can be stated that prior to post-curing taking place, the conversion of layers in the present PWB substrates is in mirror image relationshop relative to the aforementioned centre plane, such that there is decreasing conversion from the inside outwardly (inner layers are solidified to greater extent than outer layers).

The products manufactured by the process according to the invention have as an advantage that the internal stresses within the product are lower and more evenly distributed than is the case in comparable products, such as those known from EP 478 051 and U.S. Pat. No. 4,943,334. The known products were made using methods requiring UD fibres of at least two orientational directions to be kept under tension. This gives rise to a higher stress level than in the process according to the invention, in which, each time, the tension in a single direction is fixed by curing the matrix material to such a degree that it will not be brought to flow again. It is of importance to have low internal stress in a laminate. Needless to say, it is a prerequisite that all this stress should not exceed the Euler buckling limit. However, it is also of importance for the internal stress not to be too close to this limit, since additional stresses conceivably introduced in the course of further processing of the laminate would render the material unstable, so increasing the risk of buckling. A further advantage of the products according to the invention consists in the properly homogeneous distribution of the internal stress and its relaxation. The latter is notably on account of the fact that inner layers were able to relax before outer layers were added.

The materials employed in carrying through the present invention are not especially critical. Preferably, use is made of the materials discussed hereinafter.

The matrix material is a thermoplastic or a thermosetting polymer, preference being given to thermosetting resins. More preferred is the use of an epoxy resin based matrix material, but other resins are also useful in principle. Examples include cyanate esters, unsaturated polyester (UP) resins, vinyl ester resins, acrylate resins, BT epoxy resin, bismaleimide resin (BMI), polyimide (PI), phenol resins, triazines, polyurethanes, silicone resin, biscitraconic resin (BCI). Alternatively, combinations of said resins may be employed, and it is also possible to mix the aforementioned resins with certain appropriate thermoplasts, such as PP0, PES, PSU, and PEI among others. It is of advantage to incorporate compounds into the matrix material which will render it flame-resistant, such as phosphorus or halogen- (particularly bromine-) containing compounds. A particular matrix material which is preferred for its favourable flow and curing properties comprises about 100 parts by weight of Epikote®828 EL, about 73 parts by weight of Epikote®5050, and about 30 parts by weight of isophorone diamine.

With respect to the addition of flame-retardancy rendering compounds, notably bromine compounds, it is further noted that in view of their detrimental effect on the environment, such compounds should be used in minimal quantities. The process according to the invention is advantageous in this respect in that it allows for the various layers in the laminate to be put together in such a way that only the outer layers are substantially flame-resistant, which is sufficient to prevent the laminate from catching fire. Such a step may also be taken in the case of multilayer PWBs.

To the matrix material fillers may be added in the conventional manner, for instance quartz powder and glass powders such as boron-silicate glass powder. Furthermore, the matrix may be rendered catalytic for electroless copperplating, e.g. by adding noble metal or compounds of noble metal, notably palladium.

While the preferred reinforcing material consists of filament yarns (untwisted strands), non-continuous fibres may also be employed. According to the invention, the reinforcing yarns are preferably selected from the following group of materials: glass, e.g. E-glass, A-glass, C-glass, D-glass, AR-glass, R-glass, S1-glass, and S2-glass, as well as various ceramic materials, such as alumina and silicon carbide. Also suited to be used are polymer based fibres, more particularly so-called liquid-crystalline polymers, such as paraphenylene terephthalamide (PPDT), polybenzobisoxazole (PBO), a polybenzobisthiazole (PBT), and polybenzoimidazole (PBI), as are fibres based on polyethylene naphthalate (PEN), polyethylene terephthalate (PETP), and polyphenylene sulphide (PPS).

In general, the fibre content in the matrix is about 10–90 vol. % preferably in the range of about 40 to about 70 vol. %. A fibre volume fraction of about 50 vol. % is highly satisfactory.

In addition, the method according to the invention permits the manufacture in a comparatively inexpensive manner of PWBs with a thin core layer. It is customary to make use of substrates reinforced with thin woven fabrics to this end. For instance, a thin core substrate having a thickness of 100 μm is commonly made from a resin reinforced with two layers of "Style 108" glass fabric having a surface weight of 1.4 ounce/square yard. Such thin woven fabrics are made from 5.5 tex textile glass yarn, which generally costs about 10 times as much as a 136 tex roving. According to the invention, it is possible to use such a comparatively inexpensive 136 tex roving to obtain a thin core laminate. It should be noted in this connection that fibre-reinforced PWB substrates may be distinguished by their thickness factors (T-factor), T being defined as the ratio of the substrate thickness in μm to the average linear density of the yarn (in tex). The invention provides laminates having a T-factor of less than 5.5. This advantage is associated with the process described hereinbefore, since the use of a pre-formed, non-flowing UD composite makes it possible to retain a high degree of spread, for instance as achieved with the aid of a convex feeding zone, as a result of the at least partial consolidation.

The invention also relates to multi-layer PBWs (MLBs). In particular, the composite laminates according to the invention are very suited to be used in the process as specified in non-prepublished international patent application PCT/EP 92/01133 (publication number WO 92/22192) which is to be considered incorporated herein by reference. According to this process, a hard base substrate provided with traces on both sides is laminated with an intermediate substrate, such that the intermediate substrate is composed of a hard core layer with a still plastically deformable adhesive layer at least at the side facing the conductive traces of the base substrate, and such a pressure is exerted on the laminate as will bring said hard core layer of the intermediate substrate into contact, or virtually into contact, with the conductive traces of the base substrate and fill the void between these traces with the adhesive material which bonds the base substrate and the intermediate substrate together. The composite materials according to the invention are highly suitable for use in the base substrate as well as the intermediate substrate. Thus, the invention also pertains to the use of a composite laminate made by a method according to the foregoing description for manufacturing an adhesive-coated insulating panel.

Of course, the void-filling, flowable, adhesive layer can be applied on the present laminates whenever desired. However, the method described hereinbefore, by which an adhesive layer may advantageously be provided on a composite laminate, is pre-eminently suited to be used for the manufacture of the intermediate substrates provided with the void-filling adhesive. Preference is given to the base substrate provided with traces being a PWB which was also made by the process according to the invention. A large number of polymers is suitable for use as a trace-filling glue, more particularly thermosets, such as epoxy resin (EP), polyurethane (PU), vinyl ester (VE), polyimide (PI), bismaleimide (BMI), biscitraconimide (BCI), cyanate esters, triazines, acrylates, and mixtures thereof. A wide range of additives may be added to the glue prior to its application, for instance catalysts, inhibitors, surface-active agents, thixotropic agents, and especially fillers. Said fillers are preferably selected from the following group of materials: quartz powder, glass powder, ceramic powders such as alumina powder. Preferably, the fillers to be used should have a low thermal coefficient of expansion and a low dielectric constant. Favourable results can be attained by using hollow spheres as filler, which spheres may be of either a polymeric or a ceramic material or of glass. Expandable polymeric powders in particular are suitable for use as filler.

In contradistinction with woven-fabric reinforced laminates, the composite laminates manufactured using the process according to the invention are also suited to be used in a flexible panel or laminate and in rigid-flex laminates. Woven fabrics when used in a flexible panel undergo cracking at the junctions of warp and weft fibers, due to the fact that fibers oriented in bending direction are interwoven with fibers perpendicular to the bending direction, this adverse effect being enhanced by the high fiber concentration at these junctions, which leads to cracking at a relatively low extent of bending. Such cracks cause a high concentration of stress in conductive traces present on the flexible laminate, and consequently a high chance of cracking, which leads to circuit breakage. In a flexible laminate (or in the flexible portion of a rigid-flex laminate) the orientation of the outer UD layers preferably parallels the desired bending direction. The process of the invention excellently allows the manufacture of such a flexible laminate, as it can simply be arranged that the not yet consolidated matrix material-containing fibres applied last are oriented in the desired bending direction (in other words: it is preferred that, when applying the outer layers of fibers, the production direction is the same as the desired bending direction.

In addition, the composite laminates manufactured using the process according to the invention are pre-eminently suited to be used as supporting material in devices with various integrated circuits provided thereon (multichip modules). This is notably due to the favourable TCEs, which are mostly the result of the high fibre volume fraction that can be obtained when cross-ply laminates are used, and which may be about equal to the TCEs of electronic components (chips) used in conjunction with PWBs, more particularly MLBs. Such components may be provided on top of an MLB (chip-on-board) or else be provided embedded in a substrate such as an intermediate substrate according to WO 92/01133 (chip-in-board). Further, the process according to the invention, and the composite laminates manufactured using it, maybe employed in so-called mass lamination (masslam). This process generally comprises a layer provided on both sides with electrically conductive traces being laminated with prepreg on the sides provided with the traces. According to the invention, use may be made with advantage, in continuous operation or not, of the masslam process, in which a layer provided with electrically conductive traces on both sides is passed through the laminating zone instead of—or in combination with—the preformed, non-flowing composite, and provided on either side with a layer of UD fibres-containing matrix material, especially when using a double belt press. In a subsequent laminating step, the PWB provided with UD layers thus manufactured may be laminated anew with UD layers, this time of opposite orientation, as essentially described hereinbefore.

The invention will be further illustrated with reference to the schematic drawing. This drawing relates to a preferred embodiment of the invention, according to which a single double belt press is employed for both the manufacture of the pre-formed UD composite and the final laminating process. The drawing is presented for purposes of illustration only and should not be considered limitative in any way.

The FIGURE shows a cross-section parallel to the machine direction of a device with which the process according to the present invention may be carried out. A description of the process's depicted mode of use, together with the device's component parts, is given below.

Forming the non-flowing UD composite:

Packages (2) unwind from two creels (1), preferably rolling, and so form a unidirectional bed of filament bundles (3), which is converted into a homogeneous unidirectional filament bed (5) with the aid of a yarn spreader (4).

By means of a coating unit (6) a matrix film (7) is provided on a continuous belt (8), or on a strip of foil (9) unwound from twin leaving stands (10), after which the matrix film (7) is brought together with the homogeneous unidirectional filament bed (5).

In the heated zone (11) there is impregnation and de-aeration. The two matrix-impregnated UD filament layers (12) are brought together and then pass through the heated laminating zone (13), where they are brought into contact and fuse together to form one layer.

After this, the product passes through the cooling zone (14), which it leaves as a virtually continuous band (15). This band is cut up (16) into panels (18) which are stored, e.g. in a box or on a pallet (17).

Forming the cross-ply laminate:

The same actions are described above are carried out, up to the introduction of the impregnated UD fibres into the laminating zone (13). From a box (19) panels of non-flowing UD composite rotated 90° vis-à-vis the machine direction (20) are guided through the laminating zone (13), such that the panels are provided on either side with impregnated UD fibres (12), the orientational direction of the UD fibres in the panels (18) thus being perpendicular to the orientation of the impregnated UD fibres (12). The pressed material is then treated as described hereinbefore to form the final cross-ply laminate (not depicted separately in the FIGURE). This procedure may be repeated until the desired number of layers or the desired product thickness has been achieved.

Depending on the final application of the laminate, it may be provided with an adhesive layer with the aid of a double-sided coater (21), optionally in clean box (22). Such an adhesive layer may be the above-disclosed "additive adhesive" for electroless copperplating, but it may also be a glue such as indicated in WO 92/01133 for the manufacture of multi-layer PWBs. Alternatively, a photosensitive layer (photoresist) may be applied in this way.

The cross-ply laminates manufactured in this way using a comparatively inexpensive method which produces little waste display the desired favourable properties, such as planeness, good surface area quality, low TCE.

I claim:

1. A process of manufacturing a composite laminate comprising providing unidirectionally oriented (UD) fibres (3) disposed in a single direction with not yet consolidated matrix material passing UD fibres provided with not yet consolidated matrix (7);

passing UD fibres provides with not yet consolidated matrix material (12) together with pre-formed, non-flowing composite (20) selected from UD composite and cross-ply laminate through a laminating zone (13) in layers of at least two different orientational directions, and the matrix material is consolidated.

2. The process of claim 1 wherein the pre-formed, non-flowing composite is a pre-formed, non-flowing UD composite (20).

3. The process of claim 1 wherein the laminating zone comprises a double belt press.

4. The process of claim 2 wherein providing pre-formed, non-flowing UD composite comprises in a first step forming a non-flowing UD composite (15) by passing UD fibres provided with not yet consolidated matrix material (12) through a double belt press and bringing the matrix material to a non-flowing state, and in a second step introducing a measured portion (18) of the pre-formed, non-flowing UD composite (20) into the double belt press.

5. The process of claim 4 wherein the second step further comprises introducing into the double belt press, on either side of the non-flowing UD composite (20), UD fibres provided with not yet consolidated matrix material (12) having an orientational direction which is about perpendicular to the orientational direction in the UD composite (20).

6. The process of claim 4 wherein the measured portion (18) of UD composite is formed by cutting up (16) endless UD composite (15) formed in the first step at a length that is about equal to the width.

7. The process of claim 3 wherein the double belt press comprises an isobaric laminating zone (13).

8. The process of claim 7 wherein the UD fibres and composite that are passed through the double belt press have edges, and further comprising carrying along at the edges a viscous thermoplastic polymer parallel to the double belt press direction.

9. The process of claim 1 wherein the composite laminate comprises two outer surfaces, and wherein at least one outer surface of the composite laminate has been rendered suitable for the application of traces of electrically conductive material.

10. The process of claim 9 wherein a foil (9) of a metal suitable for the subtractive forming of conductive traces is introduced between the double belt press and the UD fibres provided with not yet consolidated matrix material (12).

11. The process of claim 9 further comprising coating (21) the composite laminate (15) on at least one of the outer surfaces with a base layer to promote the adhesion of electrolessly deposited copper traces.

12. The process of claim 1 wherein the composite laminate has two outer surfaces and is rendered suitable for the manufacture of multi-layer printed wire boards by having at least one of its outer surfaces coated, downstream of the laminating zone, with an adhesive layer which still has to be brought to flow.

13. The process of claim 1 wherein a plurality of pre-formed, non-flowing composites are passed through the laminating zone simultaneously.

14. The process of claim 13 wherein a UD prepreg is passed through the laminating zone, such that the pre-formed, non-flowing composites are passed through the laminating zone at least on either side of the UD prepreg.

15. The process of claim 1 wherein at least one layer comprising a non-woven or a woven fabric is also passed through the laminating zone.

16. The process of claim 15 wherein the non-woven or woven fabric-comprising layers are passed through the laminating zone in such a way that they are alternated in mirror symmetrical relationship with UD fibre-reinforced layers, with the UD layers always forming the outer fibre-reinforced layers.

17. A composite laminate manufactured using the process of claim 1 wherein flame retardancy providing compounds are incorporated into the not yet consolidated matrix material.

18. A printed wire board comprising a composite laminate made by the process of claim 9.

19. The printed wire board of claim 18 wherein the composite laminate has a thickness factor $T=x/y$ below 5.5 $\mu m/tex$, x being the thickness of the laminate in $\mu m$ and y being the titer of the unidirectionally oriented fibres in tex.

20. A multi-layer printed wire board comprising at least three layers of conductive material and at least two layers of insulating material, wherein the insulating material comprises the composite laminate produced by the process of claim 9.

21. A substrate for a printed wire board (PWB) comprising a composite laminate of which at least one outer surface has been rendered suitable for the deposition of traces of conductive material, the composite laminate comprising matrix material reinforced with unidirectionally oriented fibres, such that the UD reinforcing fibres are present in different layers of crossing orientational directions, said layers being symmetrically positioned vis-à-vis a plane of symmetry through the centre of the laminate which runs parallel to its outer surfaces, wherein the various layers of UD reinforcing fibres have different thermal histories, such that the layers further removed from the plane of symmetry have undergone fewer thermal treatments than layers closer to the plane of symmetry have.

22. A composite laminate made by the process of claim 1.

23. A printed wire board comprising the composite laminate of claim 22.

24. A multilayer printed wire board comprising the composite laminate of claim 22.

25. A process of manufacturing a multilayer PWB comprising passing a PWB provided on both sides with electrically conductive traces through a double belt press together with UD fibres disposed in single direction provided with still solidifiable matrix material to form a UD-coated PWB, and passing the UD-coated PWB through the double belt press together with UD fibres provided with solidifiable matrix material and copper foil, with the orientation of the UD layers covering the PWB being perpendicular to the double belt press direction.

26. The process of claim 1 wherein the pre-formed, non-flowing composite is a pre-formed, non-flowing cross-ply laminate.

* * * * *

UNITED STATES PATENT AND TRADEMARK OFFICE
CERTIFICATE OF CORRECTION

PATENT NO. : 5,662,761
DATED : September 2, 1997
INVENTOR(S) : E.Middelman, P. H. Zuuring It is certified that error appears in the above-indentified patent and that said Letters Patent is hereby corrected as shown below:

Column 4, line 64, change "pass" to --past--.

<u>In the claims</u>
Claim 1, at column 14, lines 1-2, delete "passing UD fibres provided with not yet consolidated matrix";
    line 3, change "provides" to --provided--; and Signed and Sealed this Sixth Day of January, 1998

Attest:

BRUCE LEHMAN

*Attesting Officer*      *Commissioner of Patents and Trademarks*